(12) United States Patent
Semonin et al.

(10) Patent No.: US 11,393,938 B2
(45) Date of Patent: Jul. 19, 2022

(54) LASER-TEXTURED THIN-FILM SEMICONDUCTORS BY MELTING AND ABLATION

(71) Applicant: UTICA LEASECO, LLC, Rochester hills, MI (US)

(72) Inventors: Octavi Santiago Escala Semonin, San Francisco, CA (US); Daniel Guilford Patterson, Morgan Hill, CA (US); Reto Adrian Furler, San Jose, CA (US); Andrew James Ritenour, San Jose, CA (US)

(73) Assignee: UTICA LEASECO, LLC, Rochester Hills, MI (US)

( * ) Notice: Subject to any disclaimer, the term of this patent is extended or adjusted under 35 U.S.C. 154(b) by 0 days.

(21) Appl. No.: 16/373,305

(22) Filed: Apr. 2, 2019

(65) Prior Publication Data

US 2020/0321480 A1    Oct. 8, 2020

(51) Int. Cl.
*H01L 31/02* (2006.01)
*H01L 31/0236* (2006.01)
*H01L 31/056* (2014.01)
*H01L 31/0304* (2006.01)
*H01L 31/18* (2006.01)

(52) U.S. Cl.
CPC ...... *H01L 31/0236* (2013.01); *H01L 31/0304* (2013.01); *H01L 31/056* (2014.12); *H01L 31/184* (2013.01); *H01L 31/1872* (2013.01)

(58) Field of Classification Search
CPC ............. H01L 31/0236; H01L 31/0304; H01L 31/184; H01L 31/1872
See application file for complete search history.

(56) References Cited

U.S. PATENT DOCUMENTS

| | | | |
|---|---|---|---|
| 5,011,565 A | 4/1991 | Dube et al. | |
| 5,164,324 A * | 11/1992 | Russell | H01L 21/3065 438/708 |
| 2006/0102901 A1 * | 5/2006 | Im | H01L 21/0268 257/64 |
| 2009/0001523 A1 * | 1/2009 | Im | H01L 21/02532 257/627 |
| 2010/0015756 A1 * | 1/2010 | Weidman | H01L 31/1876 438/96 |
| 2016/0126381 A1 | 5/2016 | Wang et al. | |

(Continued)

OTHER PUBLICATIONS

International Search Report and Written Opinion dated Jun. 19, 2020 issued in counterpart PCT Application No. PCT/US2020/023510.

*Primary Examiner* — Matthew L Reames
(74) *Attorney, Agent, or Firm* — ArentFox Schiff LLP

(57) ABSTRACT

A photovoltaic device and a method of making the photovoltaic device are disclosed. The photovoltaic device may include a semiconductor layer epitaxially grown using a compound semiconductor material, such as a group III-V semiconductor material, wherein a surface of the semiconductor layer is textured via one or more laser pulses of a laser. The photovoltaic device may also include a dielectric layer deposited over the textured surface of the semiconductor layer, and a back metal reflector provided on the dielectric layer. The textured surface extends a path of light traveling through the photovoltaic device to increase absorption of the light within the photovoltaic device.

12 Claims, 6 Drawing Sheets

(56) References Cited

U.S. PATENT DOCUMENTS

2016/0265570 A1 9/2016 Sabau et al.
2017/0117432 A1 4/2017 Bailly
2017/0148930 A1 5/2017 Zhu et al.

* cited by examiner

LASER-TEXTURED THIN-FILM SEMICONDUCTORS BY MELTING AND ABLATION

BACKGROUND

Technical Field

The present disclosure relates generally to semiconductors of photovoltaic devices, and more particularly, to laser-textured thin-film semiconductors by melting and ablation.

Introduction

To harness energy from the Sun, a photovoltaic device may absorb light to produce electron-hole pairs, which are separated by an internal electric field of a junction to generate a voltage, thereby converting light energy to electric energy. To increase the absorption of light, manufactures have typically relied on increasing a thickness of one or more layers of the photovoltaic device, thereby increasing the overall thickness of the photovoltaic device. Another technique has been to texture an outer front surface of the photovoltaic device, particularly when the photovoltaic device comprises silicon material. While both of these methods may provide a longer optical path length within the photovoltaic device to increase absorption, these methods may be undesirable for some applications. Photovoltaic devices that have thicker layers may cost more to manufacture and may be more susceptible to degradation if the carrier diffusion length becomes shorter than the absorber thickness. Photovoltaic devices that have a textured front surface may be problematic if a textured layer absorbs light without contributing to power generation.

Accordingly, there exists a need for further improvements in the absorption of light in photovoltaic devices.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect, a method for texturing a layer in a photovoltaic device is disclosed. The method may include providing a semiconductor layer including a compound semiconductor material. The method may also include texturing a surface of the semiconductor layer by applying one or more laser pulses to the surface of the semiconductor to form a textured surface, each of the one or more laser pulses causing at least a partial melting of the surface of the semiconductor. The method may further include depositing one or more layers over the textured surface.

In another aspect, a photovoltaic device is disclosed. The photovoltaic device may include a semiconductor layer including a compound semiconductor material, wherein a surface of the semiconductor layer is textured by applying one or more laser pulses to the surface of the semiconductor to form a textured surface, each of the one or more laser pulses causing at least a partial melting of the surface of the semiconductor. The photovoltaic device may also include one or more layers deposited over the textured surface.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Figure 1:
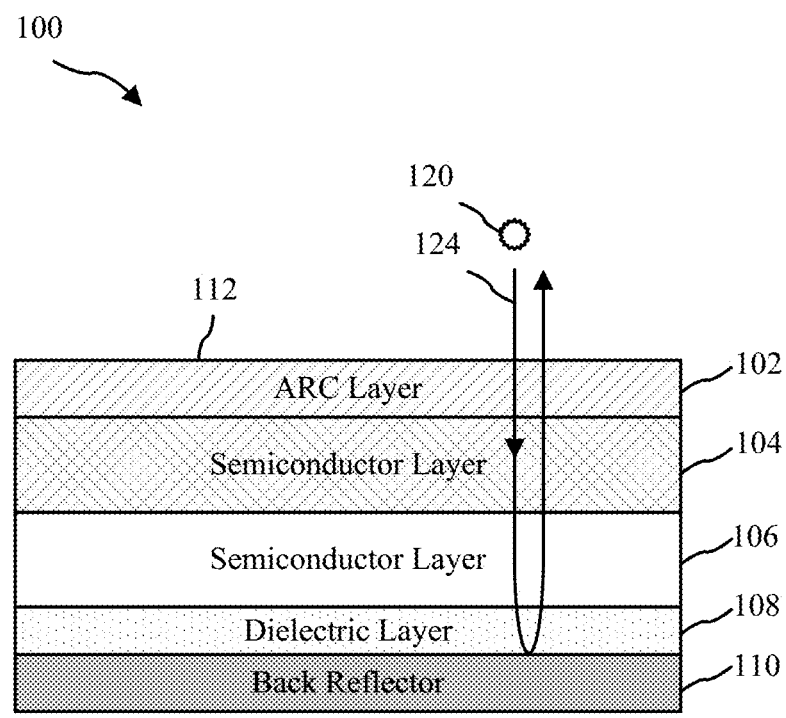
FIG. 1 illustrates examples of photovoltaic devices.
Figure 1:
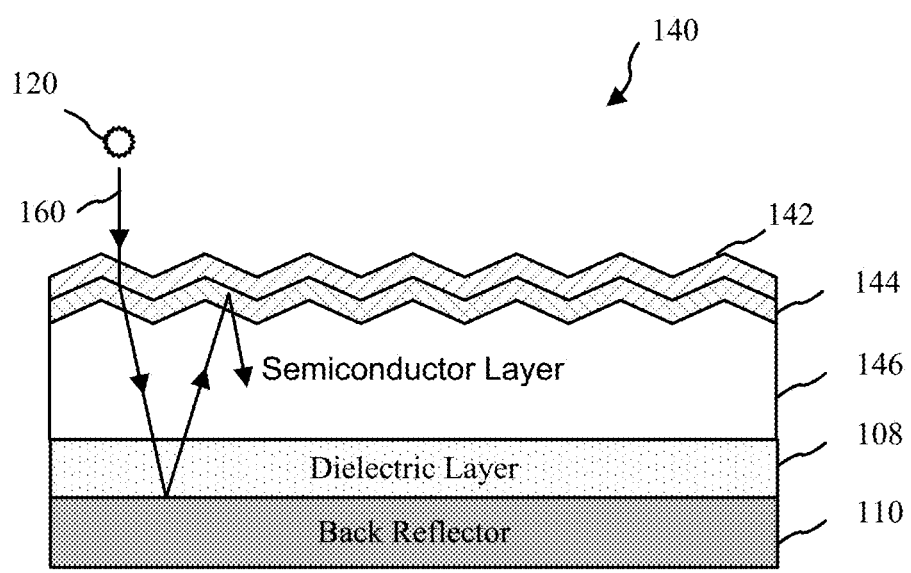

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

This disclosure describes devices, including photovoltaic devices, having thin-film semiconductors with a layer on which a laser-textured surface is formed by melting and ablation, and methods of making such devices. The laser-textured surface, which is formed on a semiconductor layer including a compound semiconductor material such as a group III-V semiconductor material, may cause a longer path for light to travel within the photovoltaic devices resulting in improved light absorption as compared to typical photovoltaic devices. Further, the laser-textured surface allows absorber layers to be thin relative to the diffusion length and in comparison to typical photovoltaic devices, while having a long optical path length.

A thickness of a photovoltaic device may be largely dictated by factors including an optical absorption coefficient, an optical path length, and a minority carrier diffusion length. The optical absorption coefficient is constant for a given wavelength or energy level, and the minority carrier diffusion length varies with material quality, which has largely been optimized in mature material systems. This is particularly important for absorbing light near a bandgap of the solar cell since the optical absorption coefficient is reduced near the bandgap.

In some cases, the thickness of the photovoltaic device may be increased to increase the optical absorption coefficient. However, a thick absorber may not be desired when manufacturing a photovoltaic device due to the time and expense involved in the growth of the absorber and/or the reduced performance due to the reduced carrier diffusion length in some applications (e.g., non-terrestrial environments) of the photovoltaic device.

In some cases, an optical path length may be enhanced through a texturing process to reduce the thickness of the solar cell. Typically, this may be accomplished by texturing one or both outer surfaces of the photovoltaic device, which may cause light to refract at a large angle and become trapped via total internal reflection (TIR) within the photovoltaic device. Use of TIR within the photovoltaic device may increase the optical path length and has been implemented with some terrestrial silicon photovoltaic devices. However, typical methods used to texture the outer surfaces of photovoltaic devices are difficult to perform on thin film photovoltaic devices.

Implementations of the present disclosure use a pulsed laser to melt and ablate a surface of a post-epitaxy wafer. For example, the pulsed laser may be used to generate one or more laser pulses that are applied to melt and ablate a surface of a non-silicon semiconductor layer of the wafer. In an example, the non-silicon semiconductor layer may be a compound semiconductor material comprising a group III-V semiconductor material, although other types of compound semiconductor materials may also be used (e.g., group II-IV semiconductor materials). After melting and ablating the surface may be re-formed through amorphization or recrystallization. The addition of a dielectric layer on the semiconductor layer creates a refracting interface between the semiconductor layer and the dielectric layer. Texturing of the post-epitaxy wafer causes light to refract such that the refracted light approaches a back surface of a layer (e.g., anti-reflective coating (ARC) layer) of the photovoltaic device at an angle, effectively trapping the in the cell thanks to TIR. Techniques described herein may perform the texturing operation after epitaxial growth and before deposition of the dielectric layer. Use of a high bandgap textured layer (e.g., $Al_xGa_{1-x}As$) at the backside of a photovoltaic device may maximize the absorption of light by an absorber layer (e.g., GaAs).

In some implementations, the laser pulses may be rasterized across the wafer such that any given location on the wafer sees multiple pulses. Increased overlapping of pulses may increase texture, which may be controlled by varying a laser spot size, spot shape and/or uniformity, a pitch, a pulse frequency, and/or pulse energy. In alternative implementations, a single laser pulse may be spread out over an entirety of the wafer (instead of rasterizing). Similarly, a pulse intensity, a frequency, and/or a number of exposures may be tuned to control physical characteristics of the texture, including, for example, locations of peaks and valleys in the texture, width of the peaks and the valleys, height of peaks, depth of the valleys, or any other physical characteristic of the texture. Pulse duration (width) and wavelength may also determine the physical characteristics of the texture, including the depth to which the material is affected and a local chemical composition of the material.

To form the textured surface of a semiconductor layer, the laser may be tuned according to desirable settings, such as those previously described, to melt or ablate the surface. Through melting, the surface may be formed through amorphization and/or recrystallization without removal of material. Through ablation, the surface may be removed and reformed through amorphization and/or recrystallization, but some material may be removed. Aspects of the present disclosure rely on melting a surface via laser pulses rather than ablating pits into the surface of the solar cell. For example, instead of merely ablating a surface, as done by typical methods, the present application describes the use of laser pulses to both reshape a surface through melting and, if needed, remove material through ablation. As a result, surface texturing based on implementations of the present disclosure may provide improved absorption while removing very little, if any, material (e.g., 0-1000 nm of material). Further, absorption near the band edge (where optical absorption is the weakest) may be enhanced for thin absorbers, resulting in improved external quantum efficiency (EQE) for textured cells (e.g., improvement in short circuit current ($J_{sc}$) of about 1-1.5 $mA/cm^2$) and improved light scattering.

Turning now to the figures, examples of photovoltaic devices and methods of manufacturing the photovoltaic devices are described herein. It is to be understood that layers in the figures may not be drawn to scale and are instead drawn for illustrative purposes.

FIG. 1 illustrates examples of a solar cell or photovoltaic device 100 and a solar cell or photovoltaic device 140. The photovoltaic device 100 may include multiple layers, including an ARC layer 102, a first semiconductor layer 104 including n-type (or n-doped) semiconductor materials or p-type (or p-doped) semiconductor materials, a second semiconductor layer 106 including doped semiconductor materials opposite the first semiconductor layer 104, a dielectric layer 108, and a back reflector layer 110 used to reflect light from a light source. For example, when light from a light source 120, such as the Sun, impinges on a front surface 112 of the photovoltaic device 100, the light may travel via a path 124 through the multiple layers of the photovoltaic device 100. If the light is not absorbed already, the light is reflected off of a surface of the back reflector 110 and travels back through the multiple layers for additional time for absorption within the photovoltaic device 100. Typically, manufacturers may increase the thickness of one or more of the layers of the photovoltaic device 100, to increase the probability of the light being absorbed. However, when increasing the thickness of any layers of the photovoltaic device 100, the overall thickness of the photovoltaic device 100 is increased, which, as discussed above, may result in an expensive or unreliable device that is undesirable for some applications.

Another way manufacturers typically increase the absorption of light is by texturing a front surface of a solar cell, as shown by the photovoltaic device 140. In this example, the photovoltaic device 140 may include a front surface of the second semiconductor layer 146 that has been textured. Manufacturers then deposit the first semiconductor layer 144 and the ARC layer 142 sequentially on top of the front surface of the second semiconductor layer 146. In this example, the light may travel via a path 160, which, when impinged on the second semiconductor layer 146, changes a direction of the light. The change in direction may create a longer path for the light to traverse (compared to the path 124) through the photovoltaic device 140 and thereby increase the probability of the light being absorbed by the photovoltaic device 140.

Typically, a texturing method on a front surface of silicon-based solar cells, such as the photovoltaic device 140, is performed through a wet etching process or a laser ablation process. Wet etching is a removal process that uses chemicals to remove silicon according to a mask deposited on the silicon, where the mask defines a pattern for texturing. Laser ablation includes a pulsed laser used to remove large pits (e.g., greater than 10 μm) from the silicon by vaporizing a material and thereby creating a textured surface.

However, due to the reduced thickness (e.g., less than 10 μm) of thin-film non-silicon solar cells, surface texturing via wet etching or laser ablation processes remain challenging as both these processes remove a significant amount (e.g., greater than 2 μm) of material. Non-silicon solar cells typically have thin absorber layers because of their high optical absorption coefficients and relatively short diffusion lengths.

Thin-Film Photovoltaic Device

Figure 2:
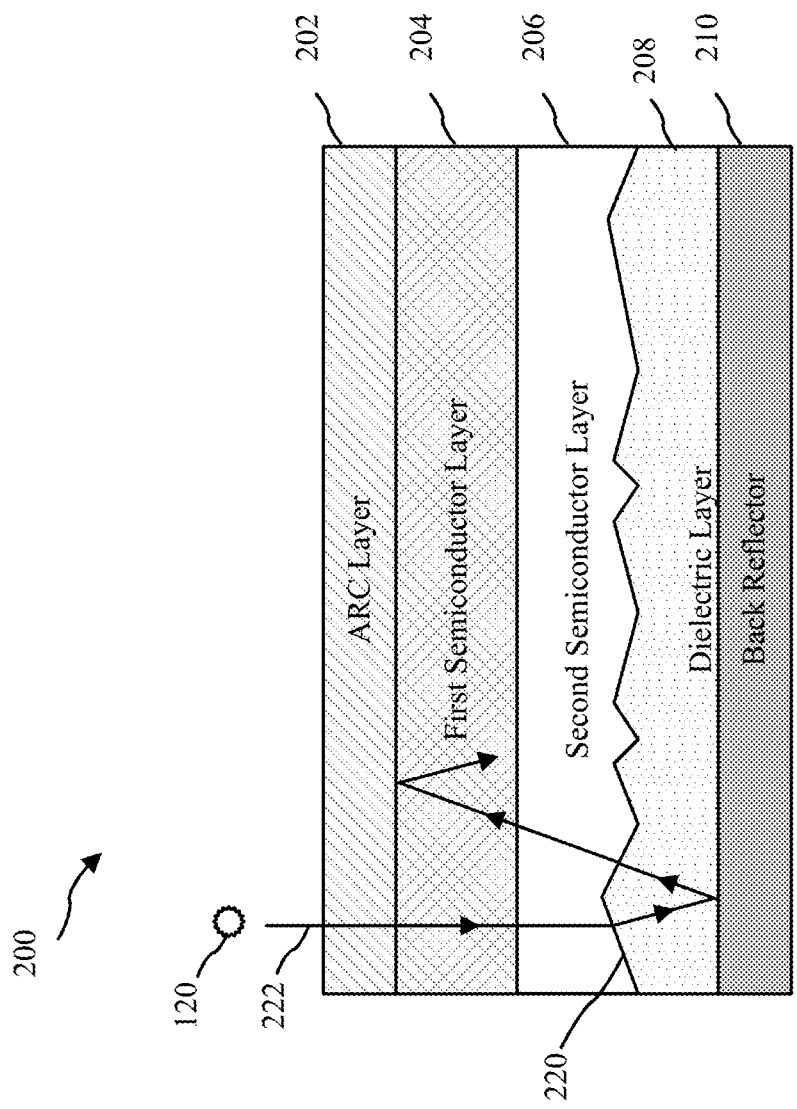
FIG. 2 illustrates an example of a photovoltaic device having a textured surface according to aspects of the present disclosure.

FIG. 2 illustrates an example of a thin-film photovoltaic device 200 having a textured surface according to aspects of the present disclosure. As shown by FIG. 2, the thin-film photovoltaic device 200 may include an ARC layer 202. In an example, the ARC layer 202 may be disposed on the front surface of a first semiconductor layer 204. The ARC layer 202 may contain a material that reduces a net reflection from a front surface of the ARC layer 202 and a back surface of the ARC layer 202 (which is also a front surface of the first semiconductor layer 204). The ARC layer 202 takes interference between these two reflections to obtain a nulling effect that reduces an overall reflected intensity. In some examples, the ARC layer 102 may contain magnesium fluoride ($MgF_2$), zinc sulfide (ZnS), titanium oxide (TiO), titanium dioxide ($TiO_2$), niobium oxide (NbO, $NbO_2$, or $Nb_2O_5$), silicon nitride ($Si_3N_4$), silicon oxynitride (Si-OxNy), silicon oxide (SiO), silicon dioxide ($SiO_2$) silicon oxide (SiO), derivatives thereof, or combination thereof. In some examples, the ARC layer 202 may be one or more layers of material.

The thin-film photovoltaic device 200 may also include the first semiconductor layer 204. In some examples the first semiconductor layer 204 may include compound semiconductor materials (e.g., non-silicon based materials) such as group III-V semiconductor materials, although other types of compound semiconductor materials may also be used (e.g., group II-IV semiconductor materials). The group III-V semiconductor materials may include thin films of epitaxially grown layers which may contain a combination of two or more of gallium (Ga), arsenic (As), aluminum (Al), indium (In), or phosphorus (P) (e.g., GaAs, AlGaAs, InGaP, AlInGaP, InGaAs, AlInGaAs, InGaAsP, or AlInP). In some examples, the compound semiconductor materials of the first semiconductor layer 204 may include n-type (or n-doped) semiconductor materials or p-type (or p-doped) semiconductor materials. For examples described in the present disclosure, the compound semiconductor materials of the first semiconductor layer 204 are described as including n-type semiconductor materials. In some aspects, the first semiconductor layer 204 may also include a film stack containing multiple layers of varying compositions of materials including the group III-V semiconductor materials. For example, the first semiconductor layer 204 may include a contact layer, a front window, an absorber layer, and/or an intermediate layer.

The thin-film photovoltaic device 200 may further include a second semiconductor layer 206. In some examples, the second semiconductor layer 206 may include compound semiconductor materials such as the group III-V semiconductor materials described above. The compound semiconductor materials of the second semiconductor layer 206 may include doped semiconductor materials opposite of the doped semiconductor materials of the first semiconductor layer 204. For examples described in the present disclosure, the compound semiconductor materials of the second semiconductor layer 204 are described as including p-type semiconductor materials. In some aspects, the compound semiconductor materials of the second semiconductor layer 206 may include a film stack containing multiple layers of varying compositions of materials including the group III-V semiconductor materials. For example, the second semiconductor layer 206 may include an emitter layer and/or a contact layer. During manufacturing, the second semiconductor layer 206 may be epitaxially grown on a back surface of the first semiconductor layer 204.

In an implementation, a back surface of the second semiconductor layer 206 may be textured to improve light trapping within the thin-film photovoltaic device 200. In an example, once the second semiconductor layer 206 has been epitaxially grown, the back surface of the second semiconductor layer 206 may be textured through a texturing process. In an example, the texturing process may include a laser pulsing process to melt and recrystallize the back surface of the second semiconductor layer 206. The textured surface 220 may allow light to change direction (i.e., refract) while traveling through the thin-film photovoltaic device 200 and to propagate via TIR.

Figure 3:
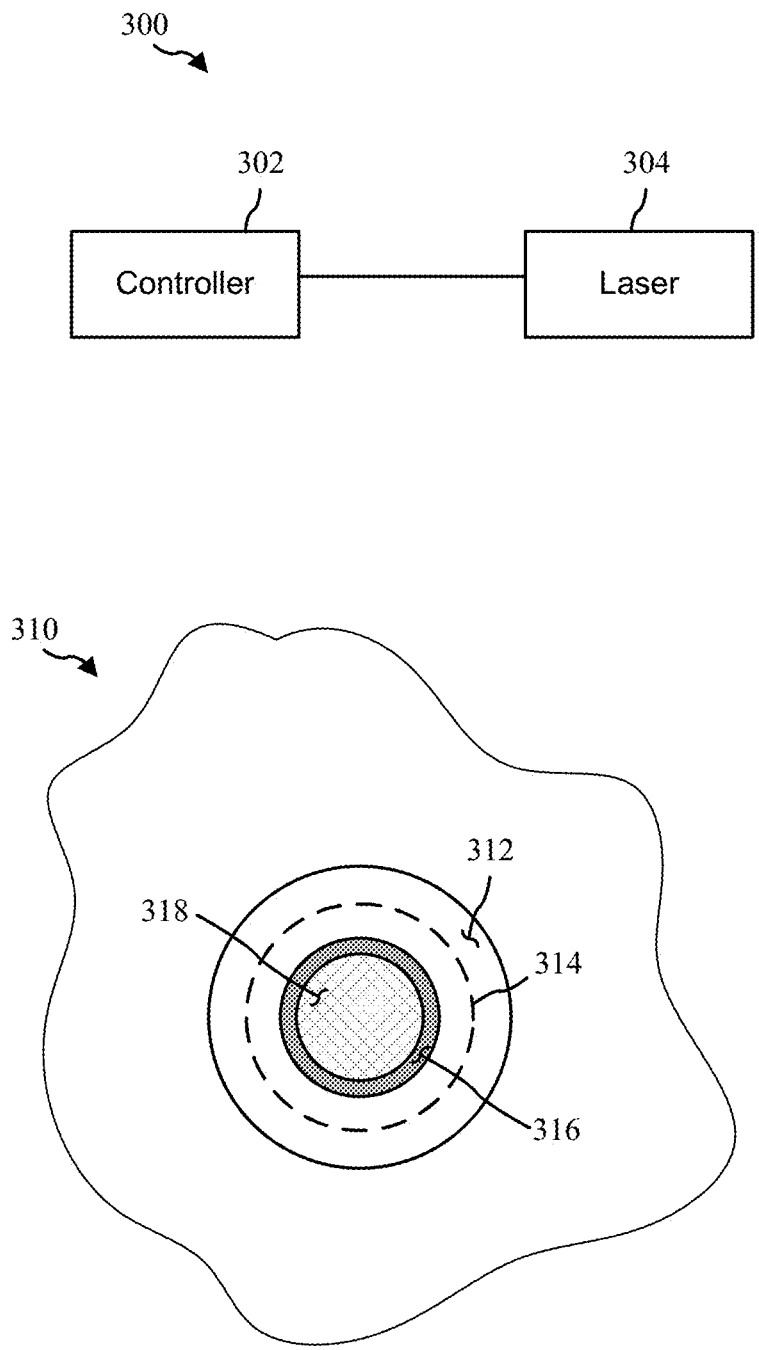
FIG. 3 illustrates an example of a laser system according to aspects of the present disclosure.

FIG. 3 illustrates an example of laser pulsing system 300 having a controller 302 and a laser 304. In an aspect, the controller 302 may control the laser 304 to generate one or more laser pulses on a surface of the second semiconductor layer 206. A laser pulse may include a high intensity of light to rapidly heat the surface of the second semiconductor layer 206. In an example, the controller may be processor configured to control the laser 304, and the laser 304 may by a laser having one or more characteristics of uniformity, such as a laser with telecentric optics, top-hat beam profile, and/or large spot size.

As a result of the laser pulse, a textured surface 310 may be generated on the surface of the second semiconductor layer 206. In an example, the textured surface 310 may only be a portion of the overall textured surface and may reflect the texturing produced on one location by the application of one or more laser pulses on that location. In an aspect, the textured surface 310 may include different areas of texturing including texturing generated by one or more of melting, ablation, amorphization, and/or recrystallization caused by the one or more laser pulses. In an aspect, the recrystallization of material may be the solidification of the material, after melting and/or ablating the material, to a well-defined shape. The amorphization of material may be the solidification of the material, after melting and/or ablating the material, to a desired shape, where the shape may not be as well defined as the recrystallization of the material. In some examples, the textured surface 310 may include a melting and amorphization area 312, where the one or more laser pulses causes the surface to melt and, once solidified, generate an amorphous area of the surface. The textured surface 310 may also include an annulus 314 which may include a slight textured area of the surface. The textured surface 310 may also include an ablation and amorphization area 316, where the one or more laser pulses causes the surface to be ablated (removed) and, once solidified, generate an amorphous area of the surface. The textured surface 310 may further include an ablation and recrystallization area 318, where the one or more laser pulses causes the surface to be ablated (removed) and, once solidified, generate crystalline material on the surface. In some examples, the elevated temperatures caused by a laser pulse may also cause materials to react with the local atmosphere to create compounds with the textured surface 310.

In some examples, the surface may be textured through one or more of the melting, amorphization, ablation, and/or recrystallization processes with little, if any, material removal (e.g., 0-1000 nm of material). Accordingly, parameters of the laser 304 may be adjusted by the controller 302 to minimize material removal.

In an aspect, the different areas of texturing may be generated based on varying energy density levels of the laser pulse. For example, the material of the second semiconductor layer 206 may melt at a first energy density (e.g., 0.27 $J/cm^2$), ablate at a second energy density (e.g., 0.52 $J/cm^2$), and recrystallize at the third energy density (e.g., 0.58 $J/cm^2$). Accordingly, varying the energy density of the laser may generate differences in texturing of the surface of the second semiconductor layer 206. In some examples, the controller 302 may control the laser 304 to have an energy density between 0.1-1.0 $J/cm^2$.

In an aspect, the controller 302 may vary one or more additional parameters of the laser 304 to generate the texture on the surface of the second semiconductor layer 206. For example, the controller 302 may tune one or more of a power of the one or more laser pulses, a spot size of the one or more laser pulses, a speed of the laser, a pitch of the one or more laser pulses, a frequency of the one or more laser pulses, or an energy of the one or more laser pulses, to texture the surface. In some examples, the controller 302 may control one or more of an intensity of the plurality of laser pulses, a spatial separation of the plurality of laser pulses, a temporal separation of the plurality of laser pulses, a shape of the plurality of laser pulses, or an atmosphere where the laser pulses interact with the surface. In an example, the parameters may be combinatorially optimized to texture the surface of the second semiconductor layer 206 according to a desired pattern.

Figure 5:
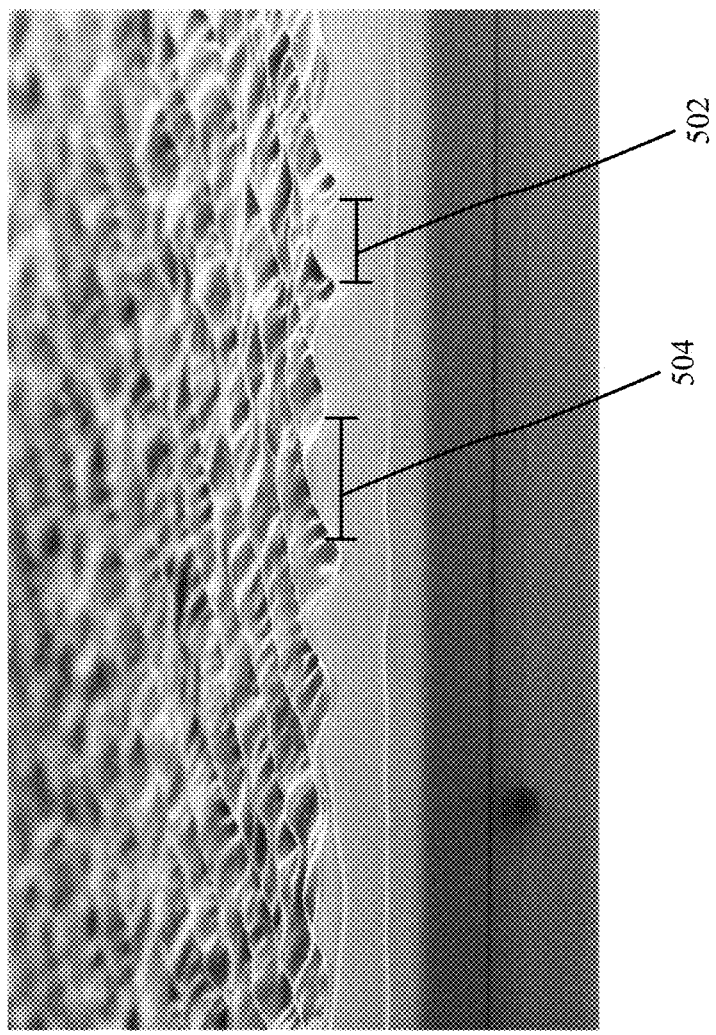
FIG. 5 illustrates examples of cross-sectional view of a textured surface according to aspects of the present disclosure.

In some examples, the controller 302 may control one or more of the parameters of the laser 304 to forming areas of the surface of the second semiconductor layer 206 to have lateral dimensions according to desired wavelength of the light to be scattered (see FIG. 5). Accordingly, the semiconductor layer 206 may be formed to scatter light corresponding to wavelengths that are known to be more efficiently absorbed by the materials of the photovoltaic device 200. For example, if materials of the photovoltaic device 200 more efficiently absorb light having wavelengths of 250-500 nm, the laser 304 may form an area of the surface of the second semiconductor layer 206 to have lateral dimensions of about 250-500 nm such that light of all wavelengths is more likely to be scattered within the photovoltaic device 200.

As an example, the controller 302 may set the laser 304 to generate one or more laser pulses according to a frequency of approximately 2.5 MHz, a power setting of 0.5 µJ/pulse, a speed of 8 m/s, a line pitch of 3 µm, and a spot size of 30 µm. In this example, the laser pulse pattern may be uniformly applied across the surface of a photovoltaic device but may be slow (i.e., take a significant amount of time to process each wafer). For example, a texturing process based on this setting may result in 10 minutes/wafer of processing time.

In another example, the controller 302 may set the laser 304 to generate one or more laser pulses according to a frequency of 250 kHz, a power setting of 50 µJ, a speed of 8 m/s, a line pitch of 30 µm, and a spot size of 300 µm. In this example, the laser pulse pattern may have uniformity issues but this setting may result in less than 1 minute/wafer of processing time.

Figure 4:
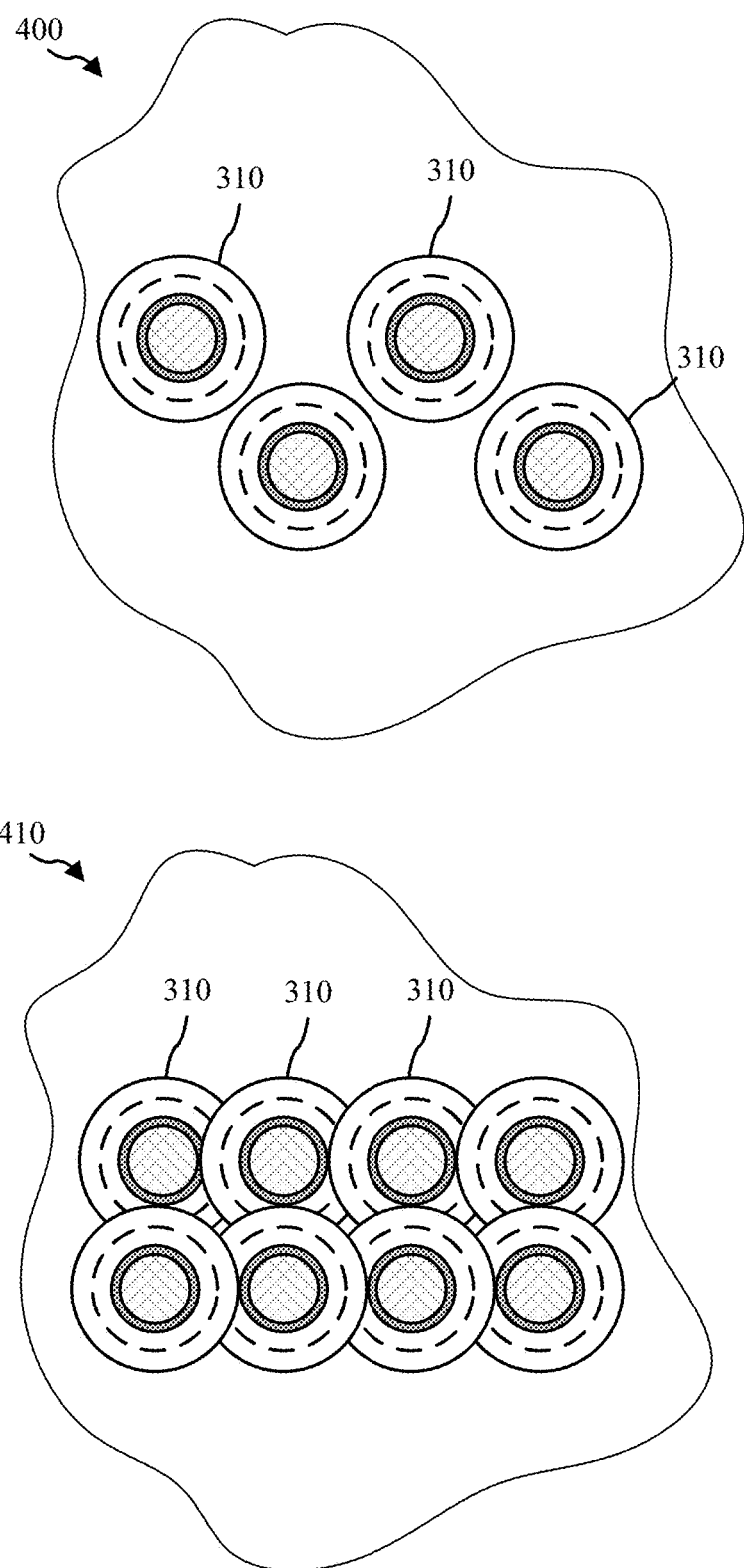
FIG. 4 illustrates examples of top-down views of textured surfaces according to aspects of the present disclosure.

FIG. 4 illustrates examples of patterns of a plurality of laser pulses that may be generated by the laser 304 on the surface of the second semiconductor layer 206 based on varying one or more of the above parameters. As shown by FIG. 4, a surface 400 of the second semiconductor layer 206 may include a plurality of textured surfaces 310 generated by a plurality of laser pulses from the laser 304. In this example, the textured surfaces may be spaced from each other, according to one or more parameters of the laser 304 described above to generate an overall textured surface according to a desired pattern. In another example, a surface 410 of the second semiconductor layer 206 may include a plurality of textured surfaces 310 having been overlapped according to one or more parameters of the laser 304. In some examples, increasing the overlap of laser pulses may result in texture. As shown by the surface 410, the controller 302 may control the laser 304 to rasterize a plurality of laser pulses over the surface 410 to generate an overall textured surface according to a desired pattern. Rasterization may result in any given location of the surface receiving multiple pulses. Examples of methods of rasterization of the laser pulses over the surface 410 may include a zig-zag method, a line-by-line method, a completely random method, or a pseudo-random method.

FIG. 5 illustrates an example of a cross-sectional view from a scanning electron microscope (SEM) of a surface 500 of a semiconductor layer after having been textured according to aspects of the present disclosure. The surface 500 may be an example of a textured surface 220 of the semiconductor layer 206. As shown, the surface 500 was textured by a plurality of laser pulses from a laser (e.g., laser 304) according to one or more parameters received from a controller (e.g., controller 302). As shown by FIG. 5, lateral dimensions 502, 504 (e.g., 710 nm and 1.3 µm, respectively) of recrystallized surfaces may be according to a range of desired wavelengths of the light to be refracted.

In an aspect, the thin-film photovoltaic device 200 may optionally include a dielectric layer 208. The dielectric layer 208 may boost the refraction (or scattering) of light impinging on or traveling through thin-film photovoltaic device 200. In some examples, the dielectric layer 208 may include an insulating material such as silicon dioxide ($SiO_2$). In an example, the dielectric layer 208 may contact the second semiconductor layer 206. The dielectric layer 208 may be deposited on the back surface of the second semiconductor layer 206 during manufacturing.

The thin-film photovoltaic device 200 may also include a back reflector 210. The back reflector 210 may include a metal to reflect traversing light. Examples of metals may include gold, silver, copper, aluminum, or other reflective metals, derivatives thereof, and/or combinations thereof. The back reflector 210 may contact a surface of the dielectric layer 208. In some examples, the back reflector 210 may be deposited on the back surface of the dielectric layer 208.

It is to be understood that one or more additional layers may be included in the thin-film photovoltaic device 200 without retracting from aspects of the present disclosure. For example, the photovoltaic devices 200 may include one or more front metal contacts between the ARC layer 202 and the first semiconductor layer 204 and/or vias through the dielectric layer 208 to connect the back reflector 210 to one or more of the first semiconductor layer 204 or the second semiconductor layer 206.

Implementation

As shown by FIG. 2, when light from a light source 120 is received by the thin-film photovoltaic device 200, the light may travel through the ARC layer 202 and into the first semiconductor layer 204 and the second semiconductor layer 206 via a path 222. If the light is not absorbed by these upper layers, the light impinges on the textured surface 220 of the second semiconductor layer 206 causing the light to change directions (refraction). The light may then be reflected via the dielectric layer 208 and the back reflector 210 into the second semiconductor layer 206 and the first semiconductor layer 204 along the path 222, which allows the light a longer path for absorption, as compared to the photovoltaic device 100. The path 222 also allows the light to be reflected off of the ARC layer 202 and thereby providing TIR within the thin-film photovoltaic device 200.

Manufacturing

Figure 6:
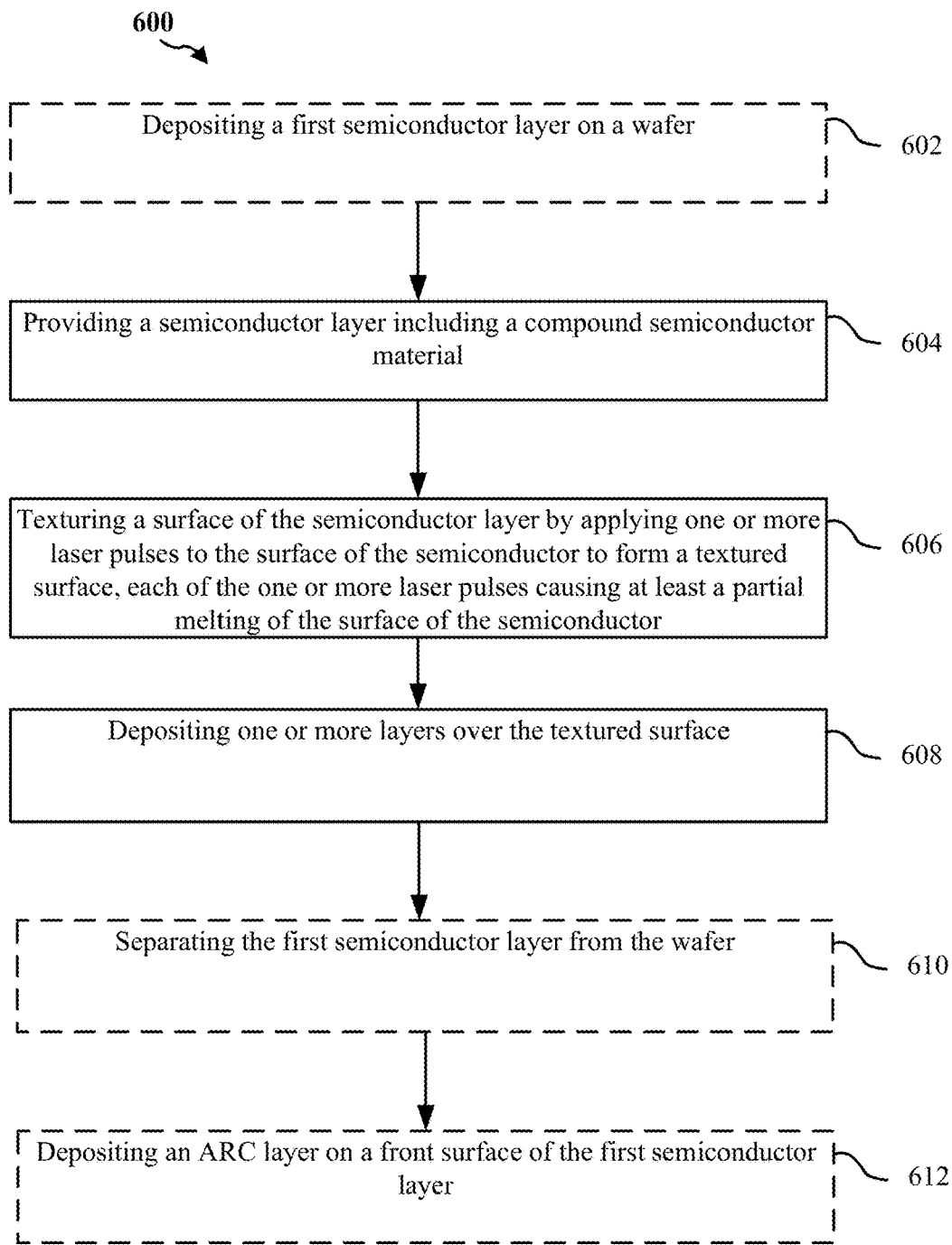
FIG. 6 illustrates an example of method of generating the photovoltaic device of FIG. 2 according to aspects of the present disclosure.

Referring to FIG. 6, an example of a method 600 for texturing a layer on a photovoltaic device, such as the thin-film photovoltaic device 200, is disclosed. At 602, the method 600 may optionally include depositing a first semiconductor layer on a wafer or another layer. In an example, the first semiconductor layer 204 may be deposited on a growth wafer (not shown), a buffer layer (not shown), or a sacrificial layer (not shown) and epitaxially grown. The first semiconductor layer 204 may include one or more epitaxially grown layers. The first semiconductor 204 may be formed by growing the group III-V materials during deposition process such as a vapor deposition process, including a high growth rate vapor deposition process. In an example, the first semiconductor layer 204 may be an n-type semiconductor layer.

At 604, the method 600 may include providing a semiconductor layer including a compound semiconductor material. For example, the semiconductor layer 206 may be provided on the first semiconductor layer 204 and may include a compound semiconductor material such as a group III-V semiconductor material including a GaAs material or an AlGaAs material epitaxially grown on the back surface of the first semiconductor layer 204. In an example, the second semiconductor layer 206 may be a p-type semiconductor layer.

At 606, the method 600 may also include texturing a surface of the semiconductor layer by applying one or more laser pulses to the surface of the semiconductor to form a textured surface, each of the one or more laser pulses causing at least a partial melting of the surface of the semiconductor. For example, the controller 302 may control the laser 304 to apply one or more laser pulses to the back surface of the second semiconductor layer 206. In an example, the back surface may be textured through one or more of a melting, amorphization, and/or recrystallization processes caused by laser pulses from the laser 304. In some examples, each of the one or more laser pulses may cause at least a partial ablation of the surface.

In some examples, the laser pulses may be rasterized over the surface of the semiconductor layer to create the textured surface. In some examples, the laser pulses may be overlapped over the surface of the semiconductor layer to create the textured surface.

In an aspect, one or more parameters of the laser may be adjusted to generate the textured surface 220. The parameters may include one or more of a power of the laser, a spot size of a laser pulse, a speed of the laser, a pitch of the laser, a pulse frequency of the laser, energy distribution within a laser spot, or a pulse energy of the laser to create the textured surface. In an aspect, laser pulse parameters may be adjusted to generate the textured surface 220. In an example, the laser parameters may include one or more of a pulse intensity of the plurality of laser pulses, a spatial separation of the plurality of laser pulses, a temporal separation of the plurality of laser pulses, a temporal or spatial pulse shape of one or more of the plurality of laser pulses, a duration of the plurality of laser pulses, a wavelength of the plurality of laser pulses, or an atmosphere where the plurality of laser pulses interact with the surface.

In some aspects, the laser pulses may melt the back surface of the semiconductor layer such that a lateral dimension of an area of the textured surface is equivalent to a desired wavelength of light.

At 608, the method 600 may further include depositing one or more layers over the textured surface. For example, the dielectric layer 208 may be deposited over the textured surface 220. As another example, the back reflector 210 may be deposited on the textured surface 220. Alternatively, the back reflector 210 may be deposited on the dielectric layer 208. In some examples, the back reflector 210 may be a metal reflector.

At 612, the method 600 may optionally include separating the first semiconductor layer from the wafer. In an example, the first semiconductor layer 204 may be separated from one of the growth wafer, the buffer layer, or the sacrificial layer, on which the first semiconductor layer 204 was deposited. In some examples, the first semiconductor layer 204 may be separated by a removal process such as etching.

At 614, the method 600 may optionally include depositing an ARC layer on a front surface of the first semiconductor layer. For example, the ARC layer 202 may be deposited on the front surface of the first semiconductor layer 204.

It is to be understood that additional operations of the method 600 may be included without retracting from aspects of the present disclosure. For example, the method 600 may include one or more operations of metallization, isolation, or etching of one or more layers to manufacture the photovoltaic device 200 according to aspects of the present disclosure.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method for texturing a layer in a photovoltaic device, comprising:
    providing a semiconductor layer including a compound semiconductor material;
    applying one or more laser pulses to a surface of the semiconductor layer to cause melting of one or more portions of the surface of the semiconductor layer by each of the one or more laser pulses, and form a melted area of the surface of the semiconductor layer;
    solidifying the melted area of the surface of the semiconductor layer to form a textured area of the surface of the semiconductor layer that is one of an amorphized area or recrystallized area, wherein a lateral dimension of a portion of the textured area is formed to have a length equivalent to a wavelength of light to be absorbed by one or more materials of the photovoltaic device; and
    depositing one or more layers over the textured area of the surface of the semiconductor layer.

2. The method of claim 1, wherein the compound semiconductor material comprises a group III-V semiconductor material.

3. The method of claim 2, wherein the group III-V semiconductor material comprises a combination of two or more of gallium (Ga), arsenide (As), aluminum (Al), indium (In), or phosphorus (P).

4. The method of claim 1, wherein the semiconductor layer comprises a p-type semiconductor material.

5. The method of claim 1, wherein the one or more laser pulses are a plurality of laser pulses, and
    wherein the method further comprises:
        patterning the plurality of laser pulses over the surface of the semiconductor layer to form the textured area.

6. The method of claim 1, wherein the one or more laser pulses are a plurality of laser pulses, and
    wherein the method further comprises:
        overlapping laser pulses of the plurality of laser pulses over the surface of the semiconductor layer to form the textured area.

7. The method of claim 1, wherein the one or more laser pulses are a plurality of laser pulses, and
    wherein the method further comprises:
        varying one or more of an intensity of the plurality of laser pulses, a spatial separation of the plurality of laser pulses, a temporal separation of the plurality of laser pulses, a temporal or spatial shape of the plurality of laser pulses, a duration of the plurality of laser pulses, a wavelength of the plurality of laser pulses, or an atmosphere where the plurality of laser pulses interact with the surface, to cause the melting of the one or more portions of the surface of the semiconductor layer.

8. The method of claim 1, further comprising:
    varying one or more of a spot size of the one or more laser pulses, a pitch of the one or more laser pulses, a frequency of the one or more laser pulses, or an energy of the one or more laser pulses, to cause the melting of the one or more portions of the surface of the semiconductor layer.

9. The method of claim 1, wherein the one or more layers includes a dielectric layer.

10. The method of claim 1, wherein the one or more layers includes a back reflector layer.

11. The method of claim 10, wherein the back reflector layer comprises a metal reflector.

12. The method of claim 1, wherein the photovoltaic device is a thin-film photovoltaic device.

* * * * *